United States Patent
Zhang et al.

(10) Patent No.: US 7,368,932 B2
(45) Date of Patent: May 6, 2008

(54) TESTING DEVICE FOR PRINTED CIRCUIT BOARD

(75) Inventors: Su-Shun Zhang, Shenzhen (CN); Wen-Jun Pan, Shenzhen (CN); Tao Chen, Shenzhen (CN)

(73) Assignees: Hong Fu Jin Precision Industry (Shenzhen) Co., Ltd., Bao-an District, Shenzhen, Guangdong Province (CN); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 137 days.

(21) Appl. No.: 11/285,668

(22) Filed: Nov. 21, 2005

(65) Prior Publication Data

US 2006/0145720 A1 Jul. 6, 2006

Related U.S. Application Data

(63) Continuation-in-part of application No. 11/048,242, filed on Feb. 1, 2005, now Pat. No. 7,015,714.

(30) Foreign Application Priority Data

Dec. 30, 2004 (CN) .................. 2004 1 0091960

(51) Int. Cl.
*G01R 31/26* (2006.01)
(52) U.S. Cl. .................. 324/763; 324/73.1; 324/754
(58) Field of Classification Search .................. None
See application file for complete search history.

(56) References Cited

FOREIGN PATENT DOCUMENTS

TW 462496 11/2001

*Primary Examiner*—Minh N. Tang
(74) *Attorney, Agent, or Firm*—Morris Manning Martin LLP; Tim Tingkang Xia, Esq.

(57) ABSTRACT

A testing device for testing a printed circuit board includes a testing signal converting module for receiving testing signals from the printed circuit board and outputting the testing signals and a plurality of I/O control signals to a plurality of testing circuits. The testing signals include a BIOS signal, an audio signal and a floppy signal. A BIOS testing and upgrading circuit test the BIOS signal from the printed circuit board according to a first control signal and updating the BIOS according to a sixth control signal. An audio testing circuit for testing audio quality includes a line out/line in circuit for an output/input test, a hp-mic circuit for a headphone and microphone test and a speaker-cd-in circuit for a speaker/cd test. A floppy switching circuit tests a read/write function and a write-protect function of a floppy signal according to a fifth I/O control signal.

20 Claims, 6 Drawing Sheets

TESTING DEVICE FOR PRINTED CIRCUIT BOARD

CROSS-REFERENCE TO RELATED APPLICATIONS

This application is a continuation-in-part of U.S. patent application Ser. No. 11/048,242, filed on Feb. 1, 2005, titled "TESTING DEVICE FOR PRINTED CIRCUIT BOARDS", now U.S. Pat. No. 7,015,714.

BACKGROUND OF THE INVENTION

1. Field of the Invention

The present invention relates to a testing device for printed circuit board, and more particularly to a testing device for testing overall functions of printed circuit board.

2. Background of the Invention

After assembling a printed circuit board into an electronic device, an overall test is required to check the functions of the printed circuit board. The test mainly aims at the defects such as open circuit, short circuit as well as the incorrect connection between the chips. After these detections, the error signals from the testing device are analyzed to find out where the error points are on the circuit board.

In a conventional arrangement, an untested printed circuit board is connected to a testing board with a plurality of terminals by manual work. The testing signals are inputted to different testing device for testing different chips and slots respectively. However, there are so many elements on the printed circuit board, it is time-consuming to connect the chips and slots with the terminals one by one, and it is labor-consuming and prone to misoperation.

Something has been done to improve the testing module. For example, a testing device for CPU comprises a transfer board and a plurality of probes. The transfer board is coupled to a CPU of the printed circuit board and enlarges a clock circuit of the CPU with a clock enlarged circuit. The probes are arranged in the transfer board and electronically connect with the transfer board as well as the footprint of the printed circuit board. However the testing device for CPU detection is only capable of the CPU testing, while the tests on the audio, the battery are ignored or have to be tested with other testing device.

Accordingly, what is needed is a testing device for testing overall functions of printed circuit board.

SUMMARY OF THE INVENTION

A testing device for testing a printed circuit board includes a testing signal converting module for receiving testing signals from the printed circuit board and outputting the testing signals and a plurality of I/O control signals to a plurality of testing circuits. The testing signals include a BIOS signal, an audio signal and a floppy signal. A BIOS testing and upgrading circuit tests the BIOS signal from the printed circuit board according to a first control signal and updating the BIOS according to a sixth control signal. An audio testing circuit for testing audio quality includes a line out/line in circuit for an output/input test, a hp-mic circuit for a headphone and microphone test and a speaker-cd-in circuit for a speaker/cd test. A floppy switching circuit tests a read/write function and a write-protect function of a floppy signal according to a fifth I/O control signal.

Other objects, advantages and novel features of the present invention will become more apparent from the following detailed description when taken in conjunction with the accompanying drawings, in which:

DETAILED DESCRIPTION OF THE PREFERRED EMBODIMENT

Figure 1:
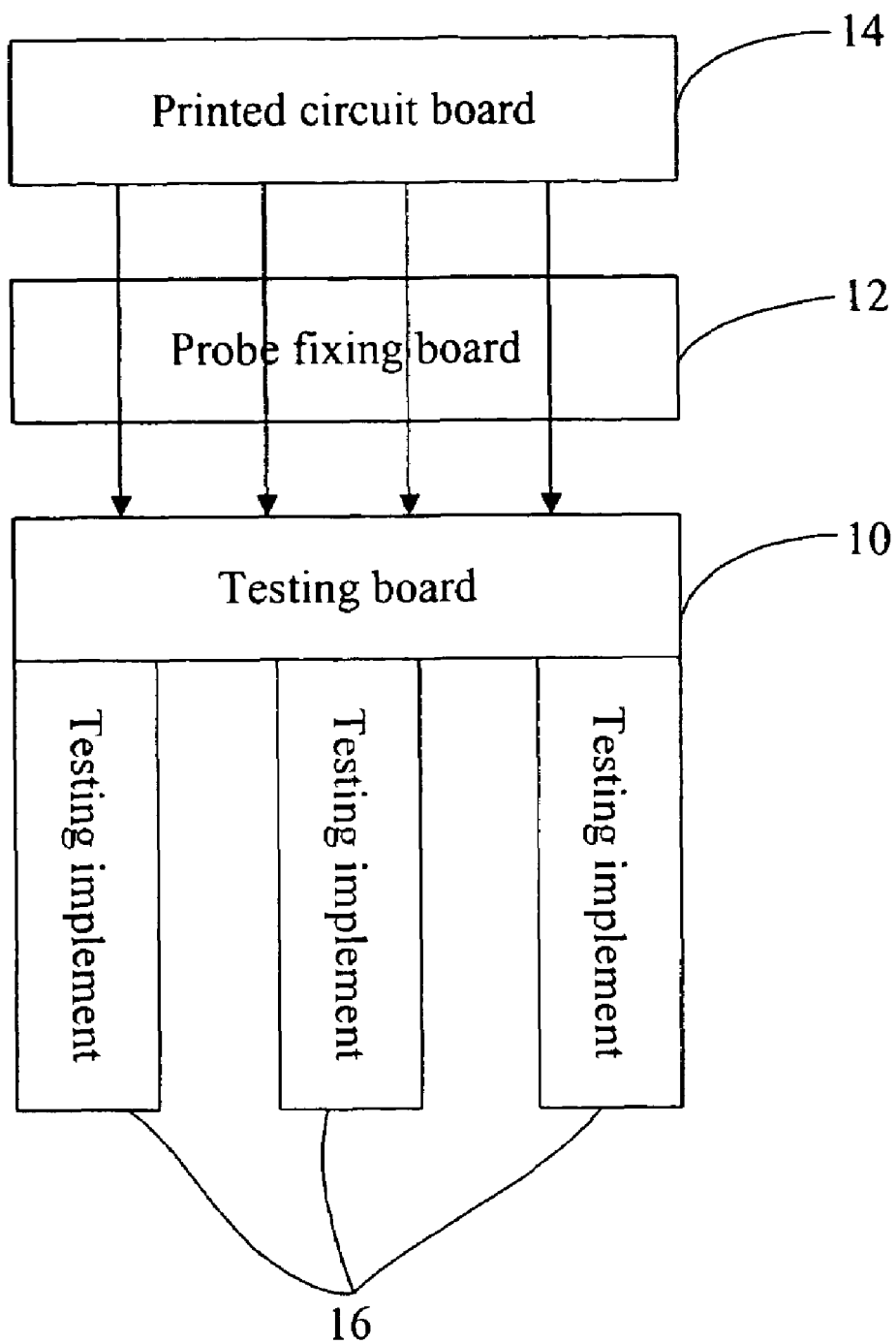
FIG. 1 is a block diagram view of a testing system in accordance with the preferred embodiment of the present invention.

Referring to FIG. 1, a testing device for printed circuit board in accordance with a preferred embodiment includes a testing board 10, a probe fixing board 12, an untested printed circuit board 14 and a plurality of testing implements 16 electrically connected to the testing board 10. The probe fixing board 12 includes a plurality of probes (not shown). When testing, the probe fixing board 12 is put between the printed circuit board 14 and the testing board 10, and outputs the testing signals from the printed circuit board 14 to the testing board 10 via the probes. These testing signals are transferred to a plurality of testing implements 16 by the testing board 10. The testing implements 16, such as displays and instruments, analyze the testing signals and show the states as well as the results thereof.

Figure 2:
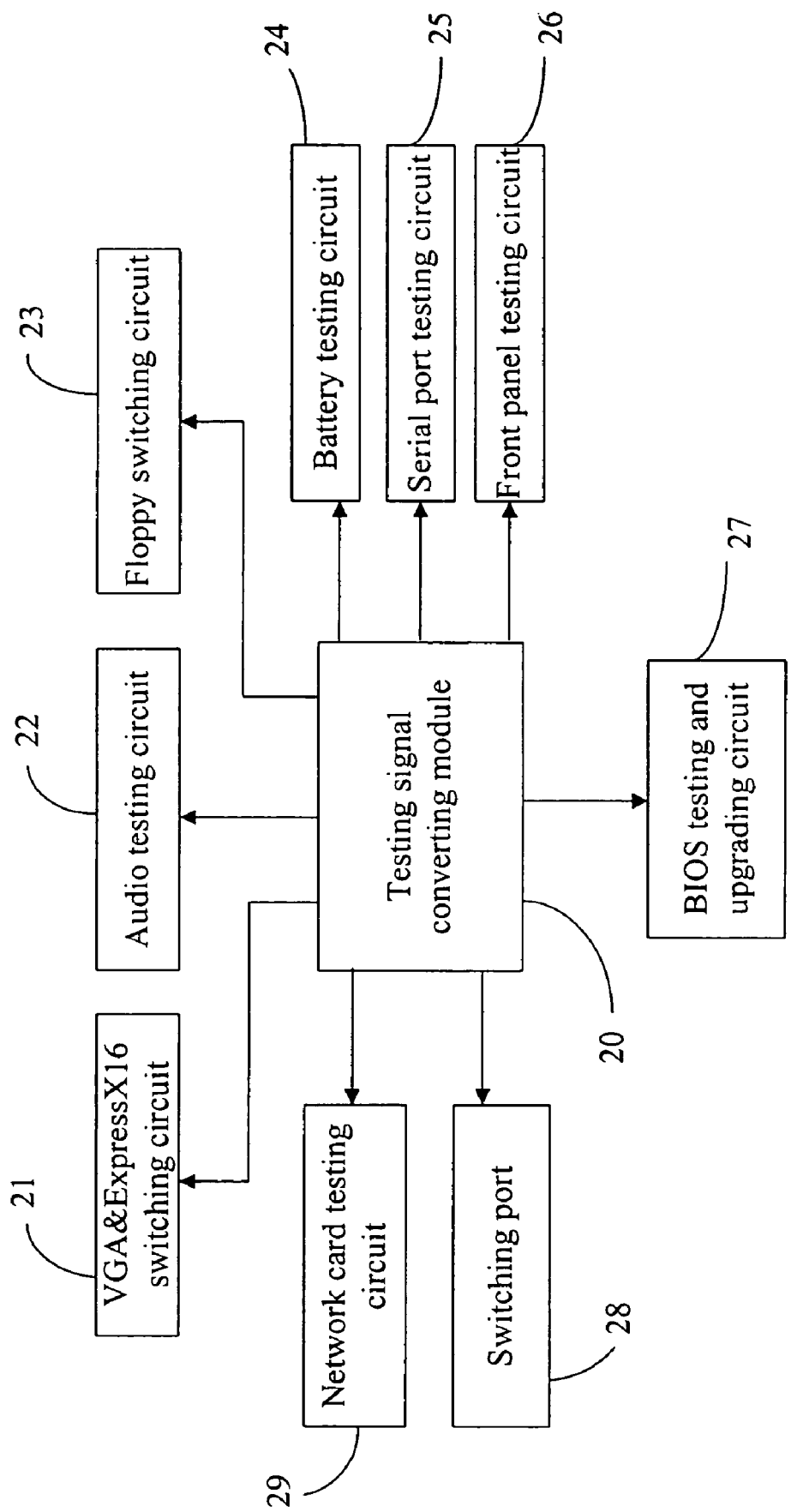
FIG. 2 illustrates a block diagram showing the structure of a testing board of FIG. 1.

Referring to FIG. 2, the testing board 10 includes a testing signal converting module 20, a VGA&ExpressX16 switching circuit 21, an audio testing circuit 22, a floppy switching circuit 23, a battery testing circuit 24, a serial port testing circuit 25, a front panel testing circuit 26, a basic input/output system (BIOS) testing and upgrading circuit 27, a switching port 28 for PCI (Peripheral Component Interface), IDE (Integrated Drive Electronics), SATA (Serial Advanced Technology Electronics), USB (Universal Serial Bus) connectors, and a network card testing circuit 29. The testing signal converting module 20 receives testing signals from the probes on the probe fixing board 12 and outputs the signals to the different testing circuits. Meanwhile, the testing signal converting module 20 outputs a plurality of I/O control signal to control the VGA&ExpressX16 switching circuit 21, the audio testing circuit 22, the floppy choosing and switching circuit 23, the battery testing circuit 24, the serial port testing circuit 25, the front panel testing circuit 26, the BIOS testing and upgrading circuit 27, the switching port 28 and the network card testing circuit 29, and to process the signals from the untested printed circuit board 14. Accordingly, the test for a display card, an audio connector, a floppy driver, a battery, a switching port and a network card can be realized.

Figure 3:
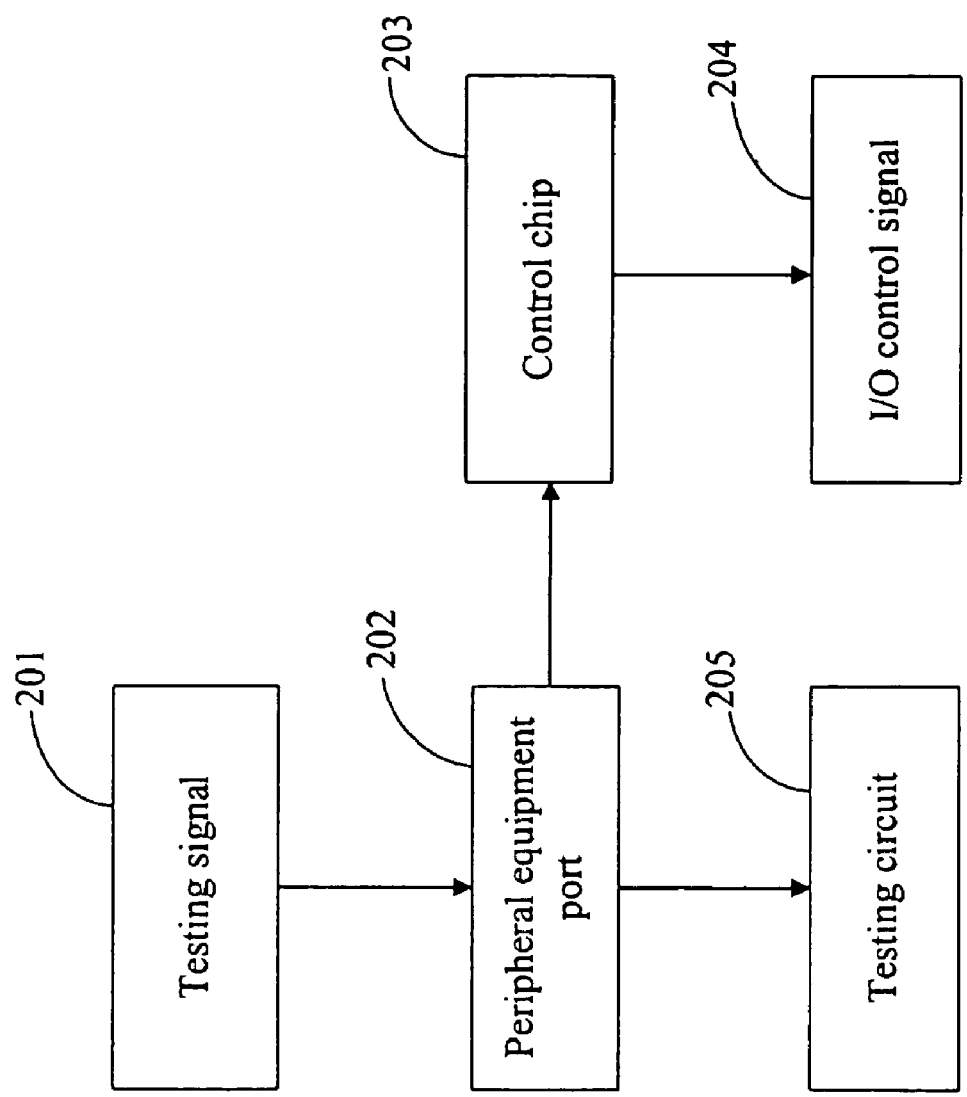
FIG. 3 illustrates a block diagram of a testing signal converting module of FIG. 2.

Referring to FIG. 3, the testing signal converting module 20 includes a peripheral equipment port 202 and a control chip 203. The peripheral equipment port 202 receives a testing signal 201 of the printed circuit board 14 and outputs the testing signal 201 to the testing circuit 205. Wherein the peripheral equipment port 202 can be an IDE port or any other port which can receive certain signal from the peripheral equipment. In the present embodiment of the invention, the peripheral equipment port 202 is a parallel port. Meanwhile, the parallel port receives signals from the printed circuit board 14 and outputs these signals to the control chip 203, and then the signals are switched into a plurality of I/O control signals 204.

Figure 4:
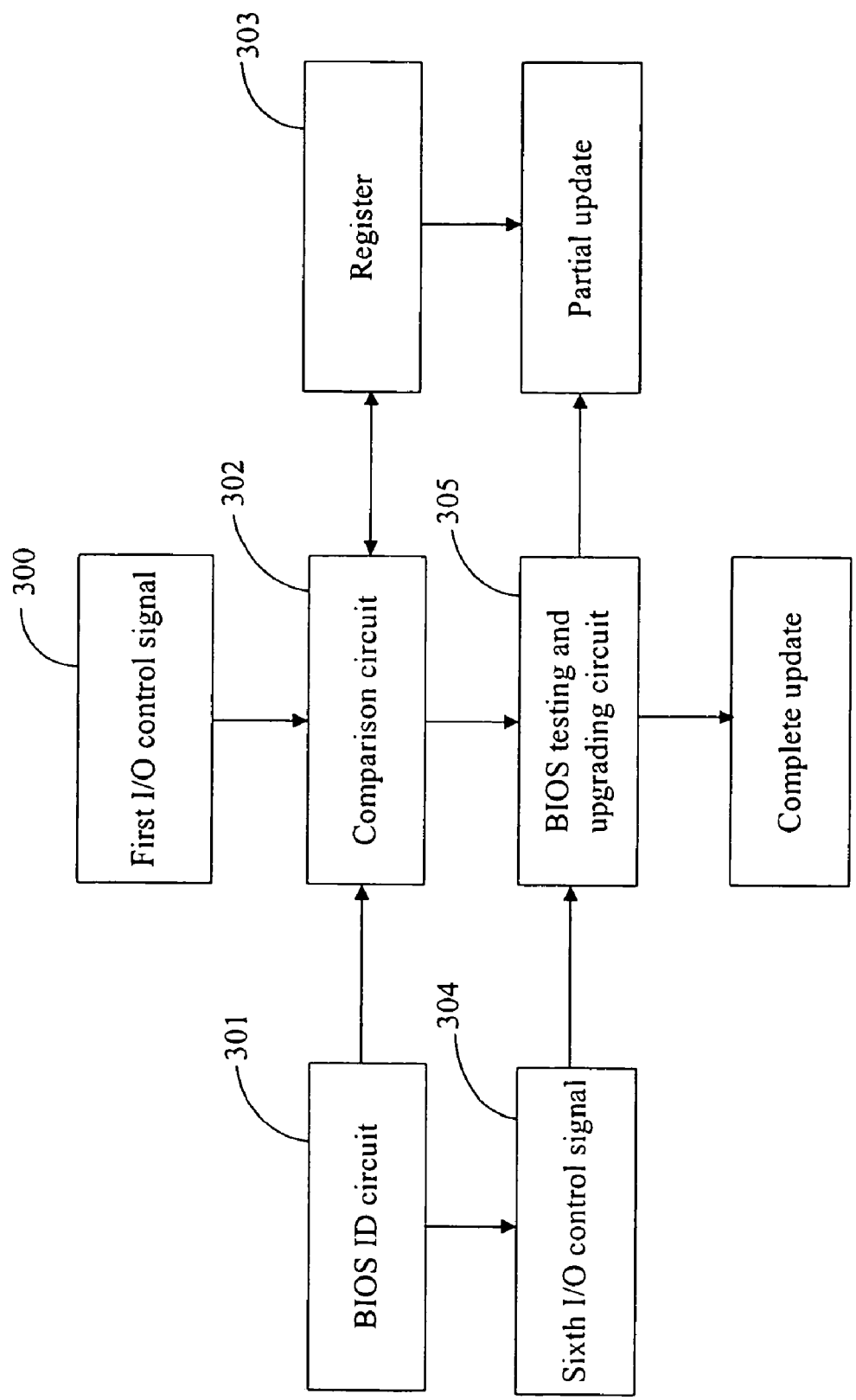
FIG. 4 illustrates a block diagram of a BIOS testing and upgrading circuit of FIG. 2.

FIG. 4 illustrates a block diagram of the BIOS testing and upgrading circuit 27. The BIOS testing and upgrading circuit 27 includes a BIOS ID circuit 301, a comparison circuit 302 and a BIOS upgrading circuit 305. The BIOS ID circuit 301 receives the BIOS standard version number of the printed circuit board 14 and outputs signal to the comparison circuit 302. The comparison circuit 302 is enabled by a first I/O control signal 300 effecting in low level. The first I/O control signal 300 comes from the control chip 203. Whether the voltage level of the first I/O control signal 300 is high or low depends on the peripheral equipment port 202. The comparison circuit 302 can read the BIOS actual version number, which is deposited in the register 303 of the untested printed circuit board 14, and compare the BIOS standard version number with the BIOS actual version number. The comparison result is in low voltage level when the BIOS standard version number matches with the actual version number. Otherwise, the comparison result is in high voltage level. Then, the comparison circuit 302 outputs a control signal to the BIOS upgrading circuit 305. The BIOS upgrading circuit 305 responds to the control signal and upgrades the BIOS according to the voltage level of a sixth I/O control signal 304. The sixth I/O control signal 304 comes from the control chip 203. If the sixth I/O control signal 304 is in high voltage level, the BIOS of the printed circuit board 14 is completely updated; if the sixth I/O control signal 304 is in low voltage level, the BIOS of the tested printed circuit board 14 is partially updated.

Figure 5:
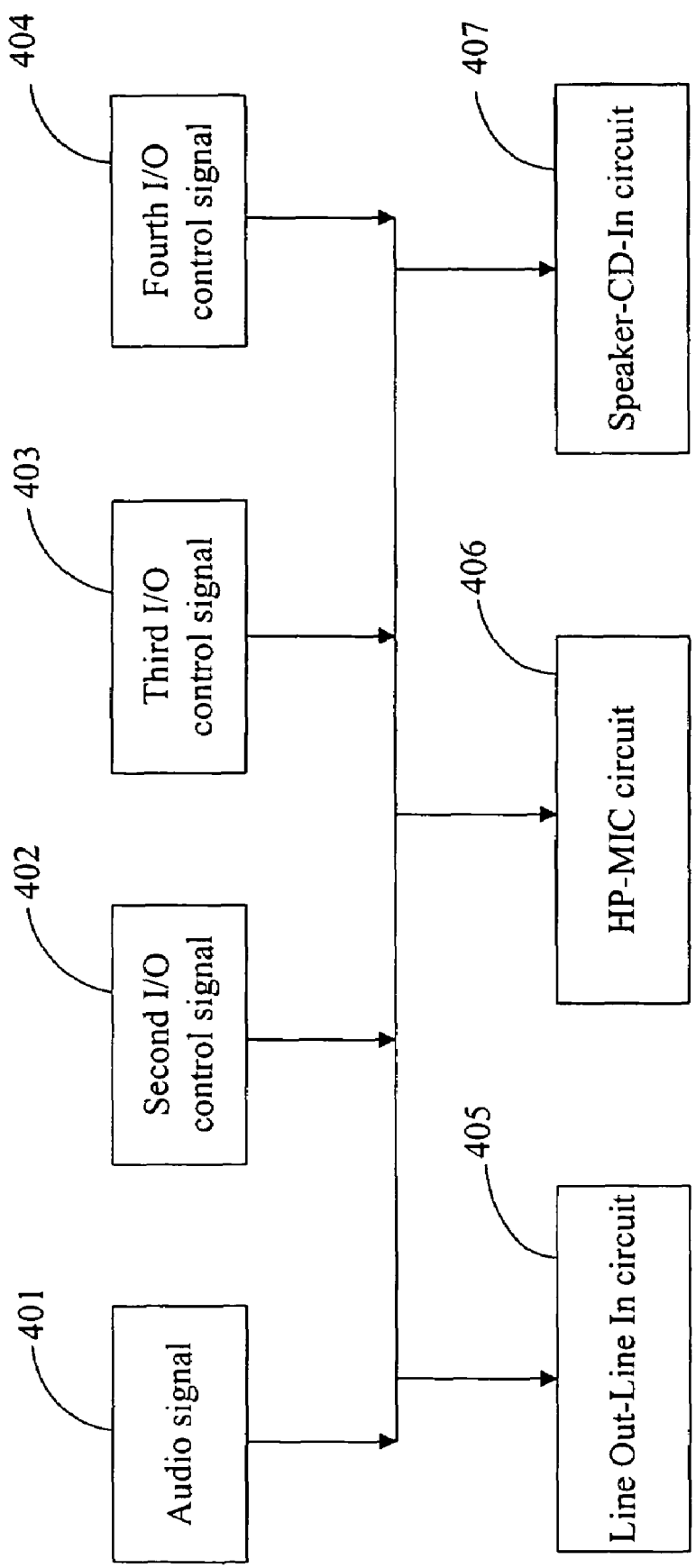
FIG. 5 illustrates a block diagram of a Audio testing circuit of FIG. 2.

FIG. 5 illustrates a block diagram of the Audio testing circuit 22. The audio testing circuit 22 includes a line out/line in circuit 405, a hp-mic(headphone-microphone) circuit 406, and a speaker-cd-in (speaker-in-compact disk) circuit 407. A second I/O control signal 402, a third I/O control signal 403, a fourth I/O control signal 404 and an audio signal 401 are inputted to the audio testing circuit 22. The second I/O control signal 402, the third I/O control signal 403 and the fourth I/O control signal 404 come from the control chip 203 of the testing signal converting module 20. Whether the voltage level is high or low depends on the peripheral equipment port 202. When the second I/O control signal 402 is in low voltage level and the fourth I/O control signal 404 is in high voltage level, the second I/O control signal 402 and the fourth I/O control signal 404 together with the audio signal 401 form a line out-line in circuit 405 for testing the audio input/output quality of the audio signal 401. When the third I/O control signal and the fourth I/O control signal are both in low voltage level, the third and fourth I/O control signal 403, 404 together with the audio signal 401 form a hp-mic circuit 406 for testing the headphone/microphone input/output quality. When the third I/O control signal 403 is in high voltage level and the fourth I/O control signal 404 is in low voltage level, the third and the fourth signal 403, 404 together with the audio signal 401 form a speaker-CD-in circuit 407 for testing the input/output quality of the speaker/CD.

Figure 6:
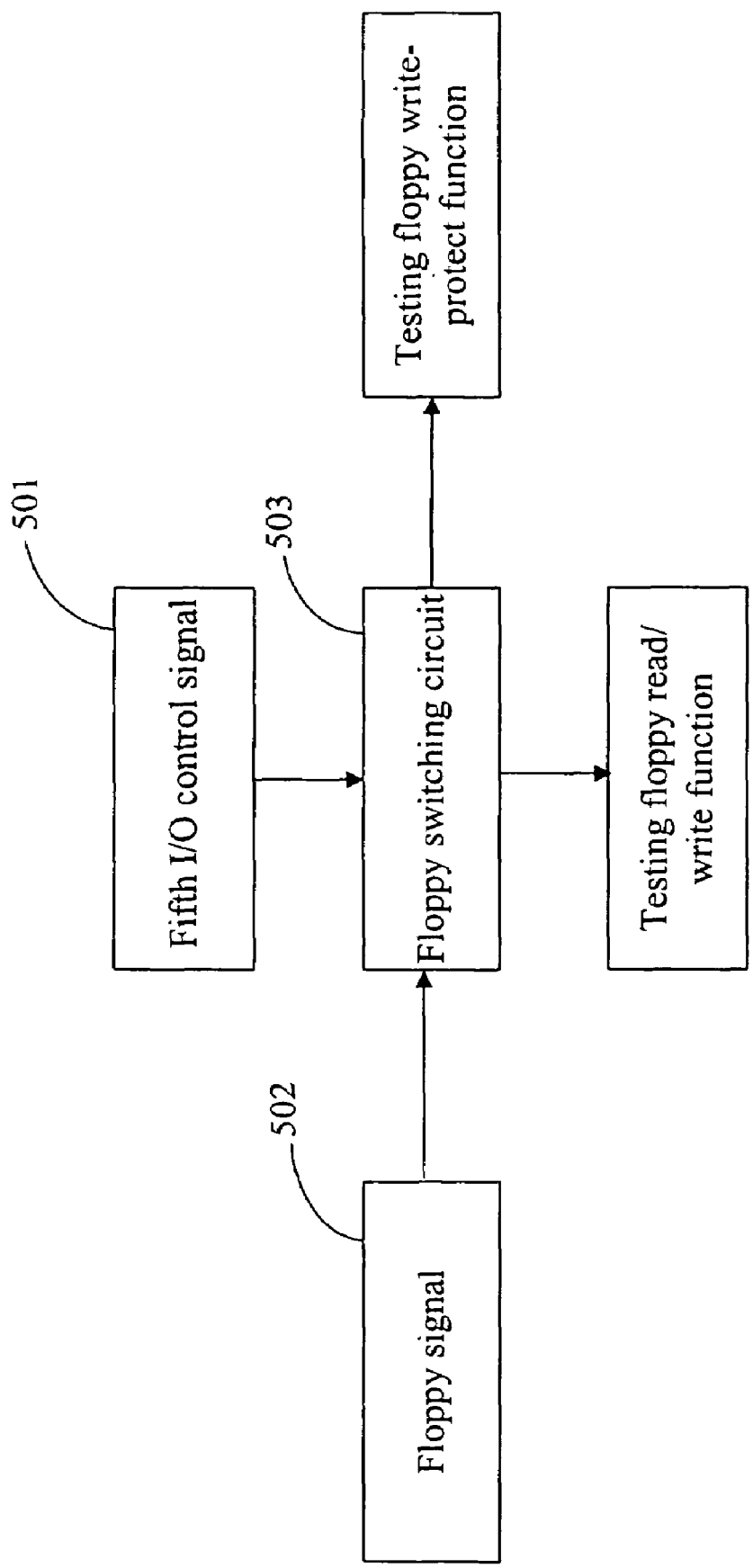
FIG. 6 illustrates a block diagram of an Floppy switching circuit of FIG. 2.

FIG. 6 illustrates a block diagram of the floppy switching circuit 23. A fifth control signal 501 and a floppy signal 502 are input to the floppy switching circuit 23. The fifth control signal 501 comes from the control chip 203. Whether the voltage level of the fifth control signal 501 is high or low depends on the peripheral equipment port 202. The floppy switching circuit 503 tests the read/write function of the floppy signal 502 when the fifth I/O control signal 501 is in low voltage level, and the floppy switching circuit 503 tests the write-protect function of the floppy signal 502 when the fifth I/O control signal 501 is in high voltage level.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A testing device for testing a printed circuit board comprising:
    a testing signal converting module for receiving testing signals from the printed circuit board and outputting the testing signals and a plurality of I/O control signals to a plurality of testing circuits, the testing signals comprising a BIOS signal, an audio signal and a floppy signal;
    a BIOS testing and upgrading circuit for testing the BIOS signal of the printed circuit board according to a first control signal and updating the BIOS according to a sixth control signal;
    an audio testing circuit for testing audio quality comprising a line out/line in circuit for a output/input test, a hp-mic circuit for a headphone and microphone circuit and a speaker-cd-in circuit for a speaker/cd test; and
    a floppy switching circuit for testing a read/write function and a write-protect function of a floppy signal according to a fifth I/O control signal.

2. The testing device for testing a printed circuit board as claimed in claim 1, wherein the testing signal converting module comprises a peripheral equipment port and a control chip.

3. The testing device for testing a printed circuit board as claimed in claim 2, wherein the peripheral equipment port receives a plurality of untested signal from the printed circuit board and outputs these signals to the BIOS testing and upgrading circuit, the audio testing circuit and the floppy switching circuit.

4. The testing device for testing a printed circuit board as claimed in claim 3, wherein the I/O control signals is outputted from the control chip controlled by the peripheral equipment port.

5. The testing device for testing a printed circuit board as claimed in claim 1, wherein the BIOS testing and upgrading circuit further comprises a BIOS ID circuit, a comparison circuit and a BIOS upgrading circuit.

6. The testing device for testing a printed circuit board as claimed in claim 5, wherein the BIOS ID circuit receives a BIOS standard version number and outputs to the comparison circuit.

7. The testing device for testing a printed circuit board as claimed in claim 6, wherein the comparison circuit reads the BIOS actual version number and compares it with the BIOS standard version number.

8. The testing device for testing a printed circuit board as claimed in claim 6, wherein the comparison circuit reads the BIOS actual version number and compares it with the BIOS standard version number.

9. The testing device for testing a printed circuit board as claimed in claim 1, wherein the update of the BIOS comprises a complete update and a partial update.

10. The testing device for testing a printed circuit board as claimed in claim 1, wherein the testing board further comprises a battery testing circuit, a serial port testing circuit, a front panel circuit, a switching port and a network card testing circuit.

11. A testing device for a printed circuit board comprising:
a testing signal converting module for receiving testing signals from the printed circuit board and outputting the testing signals and a plurality of I/O control signals to a plurality of testing circuits, the testing signals comprising a BIOS signal; and
a BIOS testing and upgrading circuit for testing the BIOS signal of the printed circuit board according to a first control signal and updating the BIOS signal according to a sixth control signal.

12. The testing device for testing a printed circuit board as claimed in claim 11, wherein the BIOS testing and upgrading circuit further comprises a BIOS ID circuit, a comparison circuit and a BIOS upgrading circuit.

13. The testing device for testing a printed circuit board as claimed in claim 12, wherein the BIOS ID circuit receives a BIOS standard version number and outputs to the comparison circuit.

14. The testing device for testing a printed circuit board as claimed in claim 13, wherein the comparison circuit reads a BIOS actual version number and compares it with the BIOS standard version number.

15. The testing device for testing a printed circuit board as claimed in claim 13, wherein the comparison circuit is enabled by a first I/O control signal effecting in a low voltage level.

16. The testing device for testing a printed circuit board as claimed in claim 11, wherein the update of the BIOS comprises a complete update and a partial update.

17. The testing device for testing a printed circuit board as claimed in claim 11, wherein the testing board further comprises an audio testing circuit, a floppy switching circuit, a battery testing circuit, a serial port testing circuit, a front panel circuit, a switching port and a network card testing circuit.

18. The testing device for testing a printed circuit board as claimed in claim 11, wherein the testing signal converting module comprises a peripheral equipment port and a control chip connected to a peripheral equipment.

19. The testing device for testing a printed circuit board as claimed in claim 18, wherein the peripheral equipment port receives a plurality of untested signals from the printed circuit board and outputs these signals to the BIOS testing and upgrading circuit.

20. The testing device for testing a printed circuit board as claimed in claim 18, wherein the I/O control signals are outputted from the control chip.

* * * * *